(12) United States Patent
Park et al.

(10) Patent No.: US 12,703,917 B2
(45) Date of Patent: Aug. 11, 2026

(54) SUBSTRATE HOLDING UNIT AND SUBSTRATE PROCESSING APPARATUS

(71) Applicant: SAMSUNG ELECTRONICS CO., LTD., Suwon-si (KR)

(72) Inventors: Hwanyeol Park, Suwon-si (KR); Kyungnam Kang, Hwaseong-si (KR); Jeonghoon Nam, Suwon-si (KR); Sejin Kyung, Seoul (KR); Daewee Kong, Yongin-si (KR); Taemin Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1052 days.

(21) Appl. No.: 17/852,628

(22) Filed: Jun. 29, 2022

(65) Prior Publication Data

US 2023/0074307 A1 Mar. 9, 2023

(30) Foreign Application Priority Data

Sep. 8, 2021 (KR) ........................ 10-2021-0119640

(51) Int. Cl.

| | |
|---|---|
| ***C23C 16/458*** | (2006.01) |
| ***C23C 16/455*** | (2006.01) |
| ***C23C 16/46*** | (2006.01) |
| ***C23C 16/50*** | (2006.01) |
| ***H01J 37/32*** | (2006.01) |
| ***H05B 3/12*** | (2006.01) |

(Continued)

(52) U.S. Cl.

CPC .... *C23C 16/4586* (2013.01); *C23C 16/45565* (2013.01); *C23C 16/46* (2013.01); *C23C 16/50* (2013.01); *H01J 37/32724* (2013.01); *H05B 3/12* (2013.01); *H05B 3/283* (2013.01); *H10P 72/7616* (2026.01); *H01J 2237/3321* (2013.01); *H05B 2203/005* (2013.01); *H05B 2203/016* (2013.01)

(58) Field of Classification Search

CPC ........................... H05B 3/28; H05B 3/12–143; H05B 3/44–48; H05B 3/265; H05B 1/0233; H05B 2203/003; H05B 2203/004; H05B 2203/005; H05B 2203/007; H05B 2203/016; H05B 3/18; H05B 3/283; H05B 3/10; H01L 21/67103; H01L 21/6875; H01L 21/68757; H01J 2237/3321; H01J 37/32724; C23C 16/46; C23C 16/50; C23C 16/4586; C23C 16/4581

USPC .............................. 219/443.1, 438; 392/438

See application file for complete search history.

(56) References Cited

U.S. PATENT DOCUMENTS 5,304,778 A * 4/1994 Dasgupta .......... C04B 35/58092 219/544
5,683,606 A * 11/1997 Ushikoshi ............... C23C 16/46 219/544

(Continued)

FOREIGN PATENT DOCUMENTS

KR 1020200098315 A 8/2020

*Primary Examiner* — Helena Kosanovic
*Assistant Examiner* — Bonita Khlok
(74) *Attorney, Agent, or Firm* — Muir Patent Law, PLLC

(57) ABSTRACT

A substrate support unit includes: a ceramic body having a surface for supporting a substrate, the ceramic body including aluminum nitride (AlN), a heat generating resistor disposed in the ceramic body, and including molybdenum (Mo), and a coating layer surrounding the heat generating resistor, and including molybdenum aluminum nitride (MoAlN).

20 Claims, 20 Drawing Sheets

(51) Int. Cl.
*H05B 3/28* (2006.01)
*H10P 72/76* (2026.01)

(56) References Cited

U.S. PATENT DOCUMENTS

| | | | | |
|---|---|---|---|---|
| 6,239,402 | B1 * | 5/2001 | Araki | H01L 23/15<br>118/725 |
| 10,462,850 | B2 | 10/2019 | Hirano et al. | |
| 2018/0124873 | A1 | 5/2018 | Kano | |
| 2018/0361048 | A1 | 12/2018 | Scarpaci et al. | |
| 2020/0139363 | A1 | 5/2020 | Handique et al. | |
| 2020/0164363 | A1 | 5/2020 | Handique et al. | |
| 2020/0350186 | A1 * | 11/2020 | Lal | H01L 21/67103 |
| 2021/0005480 | A1 | 1/2021 | Divakar et al. | |
| 2021/0037613 | A1 | 2/2021 | Sakamaki et al. | |
| 2021/0287929 | A1 * | 9/2021 | Parkhe | H01J 37/32715 |
| 2022/0102180 | A1 * | 3/2022 | Yabuhana | C04B 35/581 |
| 2023/0073259 | A1 * | 3/2023 | Chandrasekharan | C23C 16/4586 |
| 2024/0177974 | A1 * | 5/2024 | Yamagishi | H01L 21/68757 |

* cited by examiner

SUBSTRATE HOLDING UNIT AND SUBSTRATE PROCESSING APPARATUS

CROSS-REFERENCE TO RELATED APPLICATION

This application claims benefit of priority to Korean Patent Application No. 10-2021-0119640 filed on Sep. 8, 2021, in the Korean Intellectual Property Office, the disclosure of which is incorporated herein by reference in its entirety.

BACKGROUND

1. Field

Embodiments relate to a substrate support unit and a substrate processing apparatus.

2. Description of the Related Art

A semiconductor device manufacturing process includes various deposition processes such as an etching process for a semiconductor wafer, a chemical vapor deposition (CVD) process, and the like.

SUMMARY

According to an embodiment, a substrate support unit may include: a ceramic body having a surface for supporting a substrate, and including aluminum nitride (AlN); a heat generating resistor disposed in the ceramic body, and including molybdenum (Mo); and a coating layer surrounding the heat generating resistor, and including molybdenum aluminum nitride (MoAlN).

According to an embodiment, a substrate support unit may include: a ceramic body having a surface for supporting a substrate, and including an inner region and an outer peripheral region surrounding the inner region, the ceramic body including a ceramic material; first and second heat generating resistors respectively disposed in the inner region and the outer peripheral region of the ceramic body, and separated from each other, the first and second heat generating resistors including a metal or an alloy; and first and second outer coating layers respectively surrounding the first and second heat generating resistors, and including the same material as the ceramic material, and the first and second outer coating layers doped with a diffusion preventing element, wherein the diffusion preventing element is selected from a group of Be, B, C, N, Mg, P, S, Sc, Ti, V, Cr, Mn, Fe, Co, Ni, Cu, Zn, Ga, Ge, and As.

According to an embodiment, a substrate support unit may include: a ceramic body having a first surface for supporting a substrate and a second surface opposite to the first surface, and including an inner region and an outer peripheral region surrounding the inner region, the ceramic body including aluminum nitride (AlN); first and second heat generating resistors respectively disposed in the inner region and the outer peripheral region of the ceramic body, and separated from each other, the first and second heat generating resistors including molybdenum (Mo); first and second inner coating layers respectively surrounding the first and second heat generating resistors, and including molybdenum aluminum nitride (MoAlN); an outer coating layer surrounding the first and second inner coating layers, and including aluminum nitride doped with magnesium (Mg); a support disposed on the second surface of the ceramic body; and first and second feeding lines respectively connected to the first and second heat generating resistors through an inside of the support.

According to an embodiment, a substrate processing apparatus may include: a process chamber providing an internal space for processing a substrate; a substrate support unit disposed in the internal space to support the substrate; and; a gas supply unit for supplying a process gas to the internal space, wherein the support unit includes a ceramic body having a first surface for supporting the substrate and a second surface opposite to the first surface, and including an inner region and an outer peripheral region surrounding the inner region, the ceramic body including aluminum nitride (AlN), first and second heat generating resistors respectively disposed in the inner region and outer peripheral region of the ceramic body, and separated from each other, the first and second heat generating resistors including molybdenum (Mo), first and second inner coating layers respectively surrounding the first and second heat generating resistors, and including molybdenum aluminum nitride (MoAlN), an outer coating layer surrounding the first and second inner coating layers, and including aluminum nitride doped with magnesium (Mg), a support disposed on the second surface of the ceramic body, and first and second feeding lines respectively connected to the first and second heat generating resistors through an inside of the support.

BRIEF DESCRIPTION OF DRAWINGS

Features will become apparent to those of skill in the art by describing in detail example embodiments with reference to the attached drawings in which.

DETAILED DESCRIPTION

Figure 1:
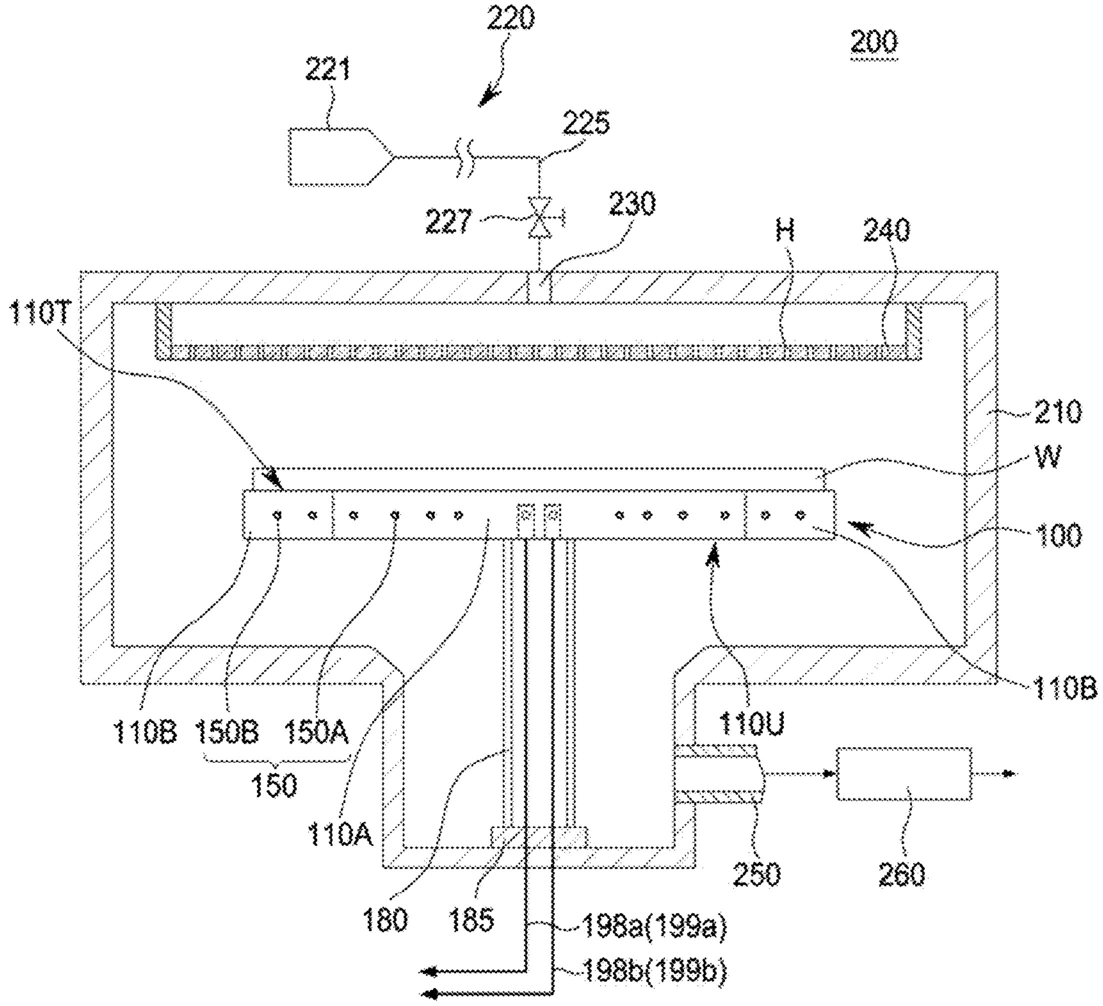
FIG. 1 is a schematic cross-sectional view illustrating a substrate processing apparatus according to an example embodiment.

FIG. 1 is a schematic cross-sectional view illustrating a substrate processing apparatus according to an example embodiment.

Referring to FIG. 1, a substrate processing apparatus 200 according to the present example embodiment may include a process chamber 201 having an internal space IS for processing a substrate W, a substrate support unit 100 disposed in the internal space IS, and a gas supply unit 220 for supplying gas to the internal space IS.

The substrate processing apparatus 200 according to the present example embodiment is exemplified as a plasma enhanced chemical vapor deposition (PECVD) configured to deposit a desired film on the substrate W disposed on the substrate support unit 100 using plasma, but the substrate processing apparatus 200 may be implemented as various other apparatuses for performing a process used for manufacturing a semiconductor while the substrate W is heated to a high temperature.

The process chamber 210 may have an internal space IS for performing a process, and may have a gas inlet port 230 for introducing gas to one side (e.g., an upper end) of the process chamber 210, and an exhaust port 250 for exhausting a reaction byproduct and residual gas generated during the process.

Referring to FIG. 1, a gas supply unit 220 may supply a process gas to an internal space IS through a gas inlet port 230. The gas supply unit 220 may include a gas storage unit 221, a gas supply line 225, and a valve 227. The gas supply line 225 may connect the gas storage unit 221 to the gas inlet port 230. Process gas stored in the gas storage unit 221 may be supplied through the gas supply line 225 and the gas inlet port 230. The valve may be installed in a gas supply line 225, and may open and close a gas supply path, or control a flow rate of process gas supplied to the internal space IS.

Process gas supplied through the gas inlet port 230 may be sprayed onto the substrate W through a shower head 240. The shower head 240 may have spray holes H for spraying gas, and may uniformly spray reaction gas onto the substrate W by means of the spray holes H. The shower head 240 may be disposed above the internal space IS of the process chamber 210 to face the substrate support unit 100. The shower head 240 may have a larger diameter than that of the substrate support unit 100.

The substrate support unit 100 may be configured to support the substrate W, which is a subject to be processed in the internal space IS.

The substrate support unit 100 employed in the present example embodiment is coupled to a heat generating unit, which is configured for heating the substrate W to a desired process temperature.

Figure 2:
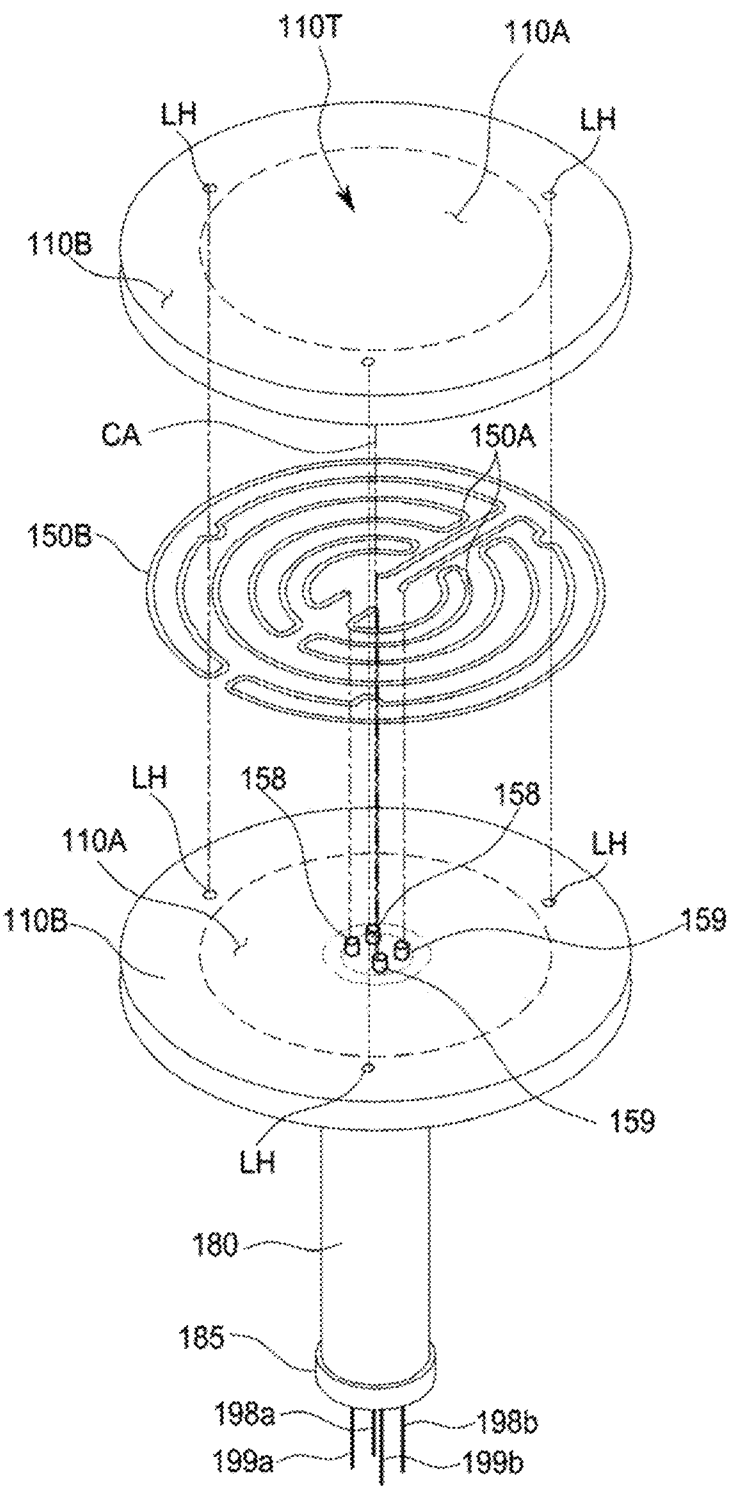
FIG. 2 is a perspective view illustrating a substrate support unit (or substrate heating unit) employable in the substrate processing apparatus illustrated in FIG. 1.

FIG. 2 is a perspective view illustrating a substrate support unit (or substrate heating unit) employable in the substrate processing apparatus illustrated in FIG. 1;

Referring to FIG. 2 together with FIG. 1, the substrate support unit 100 may include a ceramic body 110 (see FIG. 3A) provided as a substrate stage, a heat generating resistor 150 disposed on the ceramic body 110, and a support 180 for supporting the ceramic body 110.

The ceramic body 110 may have a disk-shaped structure having a first surface 110T for supporting the substrate W and a second surface 110U opposite to the first surface 110T.

The ceramic body 110 may include, e.g., aluminum nitride (AlN) (thermal conductivity: about 319 W/mK). In another implementation, the ceramic body 110 may include a ceramic having excellent thermal conductivity, such as alumina ($Al_2O_3$) or silicon carbide (SiC).

The ceramic body 110 employed in the present example embodiment may be divided into an inner region 110A including a central axis CA and an outer peripheral region 110B surrounding the inner region 110A. The inner region 110A and the outer peripheral region 110B may be configured to be heated to different temperatures. For example, the outer peripheral region 110B may be heated to a higher temperature than the inner region 110A. In order to implement such a heating temperature difference, the heat generating resistor 150 may include first and second heat generating resistors 150A and 150B disposed separately from each other in the inner region 110A and the outer peripheral region 110B, respectively, and the first and second heat generating resistors 150A and 150B may be respectively connected to different feeding circuits so that the temperature is controlled independently.

As illustrated in FIG. 2, both ends of the first heat generating resistor 150A may be connected to a pair of first feeding lines 198*a* and 198*b* through a pair of first connection electrodes 158*a* and 158*b*, respectively. Similarly thereto, both ends of the second heat generating resistor 150B may be connected to a different pair of second feeding lines 199*a* and 199*b* through another pair of second connection electrodes 159*a* and 159*b*, respectively. The first and second feeding lines 199*a* and 199*b* may be respectively connected to a heating power supply 285, and a temperature of the first and second heat generating resistors 150A and 150B may be controlled according to power supplied by the heating power supply 285, that is, a temperature of each of the inner region 110A and the outer peripheral region 110B.

The inner region 110A and the outer peripheral region 110B of the ceramic body 110 may be heated to different temperatures by a feeding circuit, configured independently from the first and second heat generating resistors 150A and 150B (which are separated from each other), and may be heated to substantially the same temperature as desired.

Figure 3A:
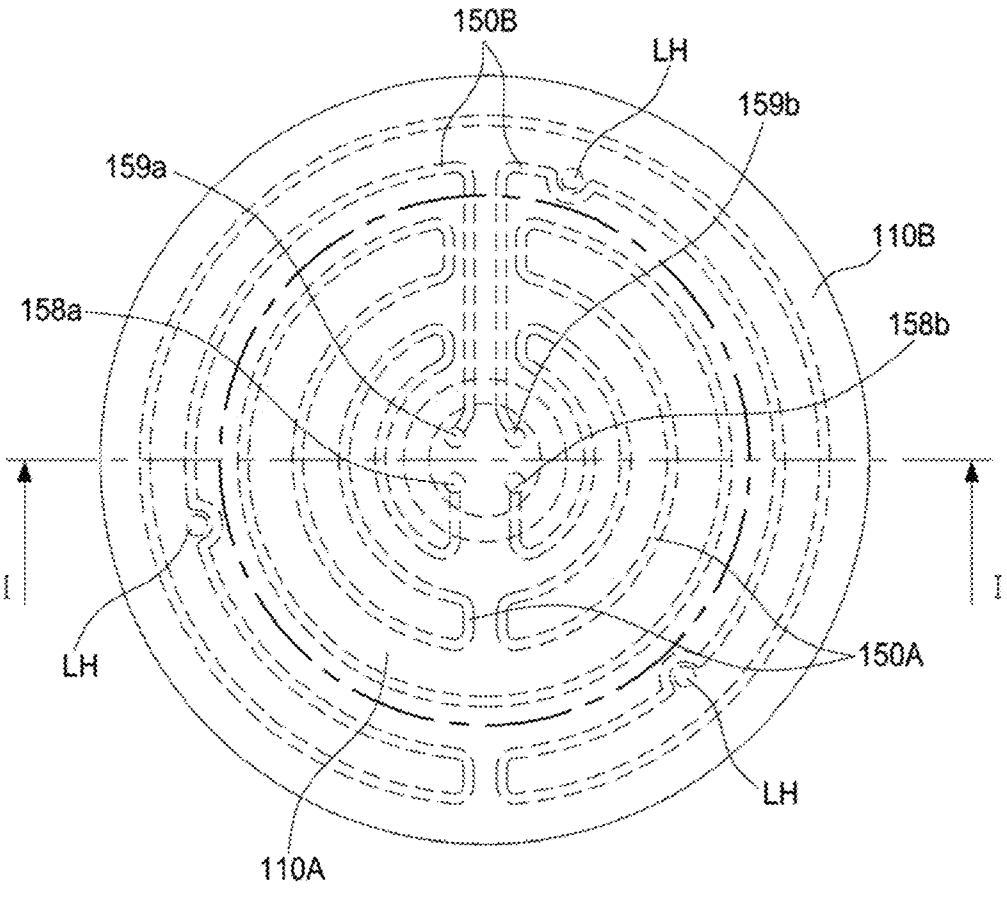
FIGS. 3A and 3B are a plan view and a cross-sectional view of a substrate support unit employable in the substrate processing apparatus illustrated in FIG. 1, respectively.
Figure 3A:
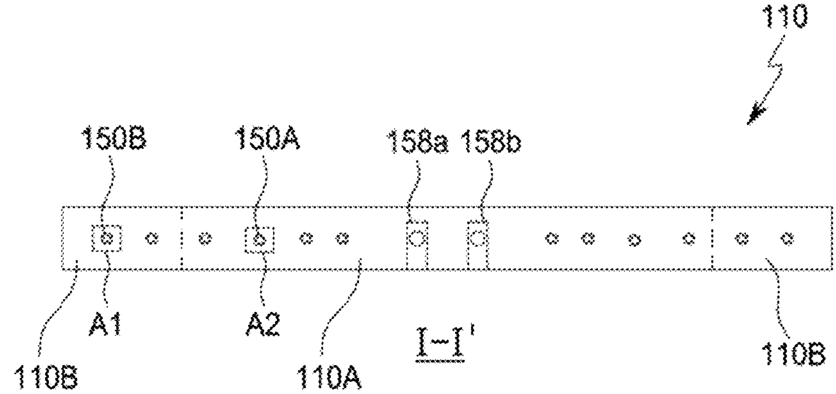
Figure 3B:
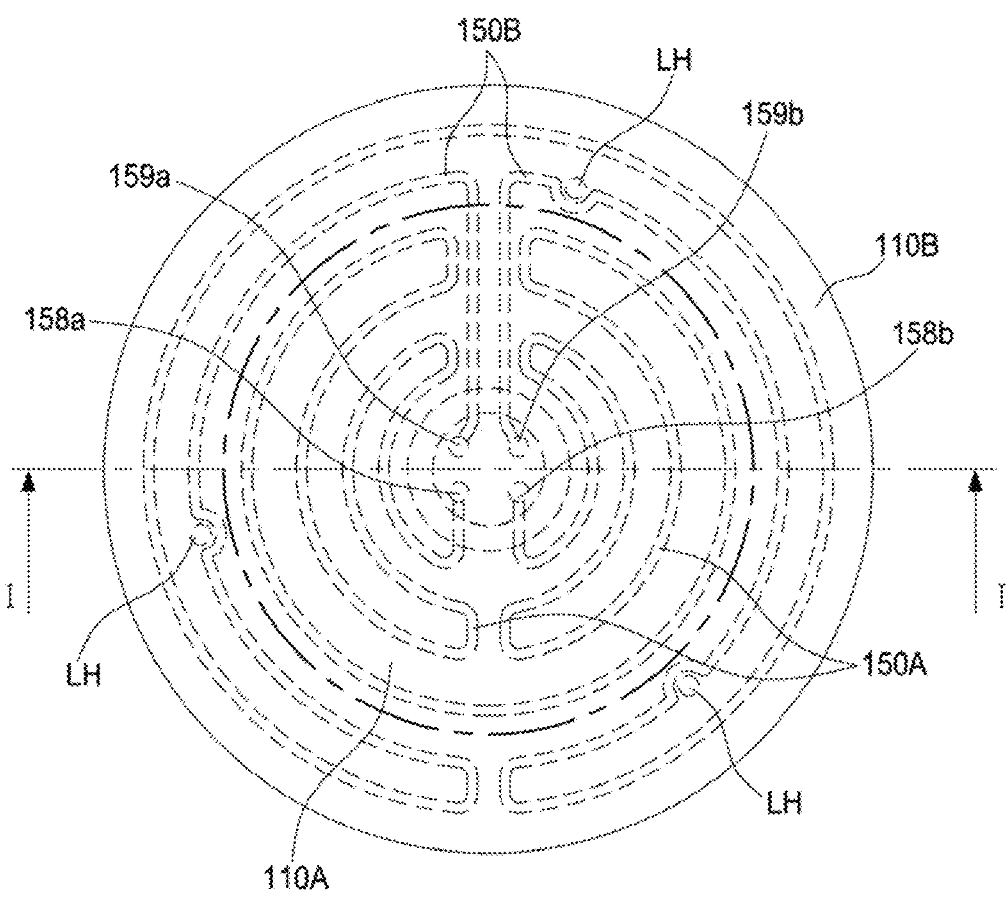
Figure 3B:
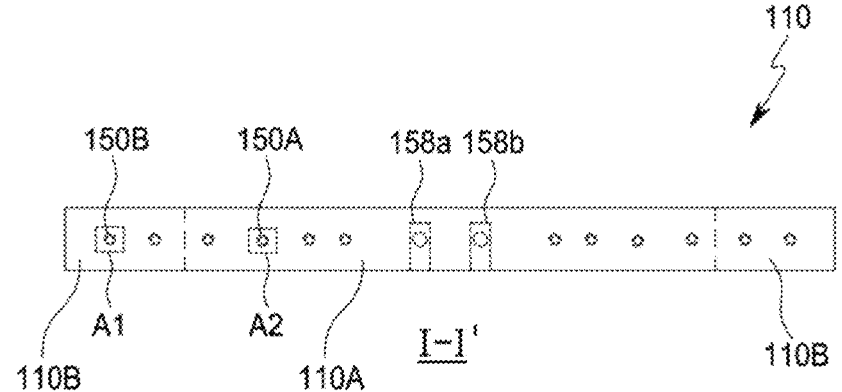

FIGS. 3A and 3B are a plan view and a cross-sectional view of a substrate support unit employable in the substrate processing apparatus illustrated in FIG. 1, respectively.

As illustrated in FIGS. 1 to 3B, first and second feeding lines 198*a* and 198*b* and 199*a* and 199*b* may be connected to a heating power supply 280 located outside a process chamber 210 through a support 180 mounted on a center of the second surface 110U of the ceramic body 110. In some example embodiments, the support 180 may be fixed by an insulating member 185 on a bottom of a process chamber. The support 180 may have a hollow cylinder structure, and the first and second feeding lines 198*a* and 198*b* and 199*a* and 199*b* may be disposed in an internal space of the support 180.

Referring to FIGS. 3A and 3B together with FIG. 2, the first and second heat generating resistors 150A and 150B may have a radially arranged hot wire coil structure. The first and second heat generating resistors 150A and 150B may be arranged in a substantially symmetrical structure in the inner region 110A and the outer peripheral region 110B, respectively.

Specifically, the first and second heat generating resistors 150A and 150B may be respectively arranged in a zig-zag pattern along an outer periphery of the ceramic body 110 to form a plurality of arcuate features. The arrangement of the first and second heat generating resistors 150A and 150B may have various other arrangements suitable for a desired temperature distribution.

The heat generating resistor 150 may include, e.g., molybdenum. In other example embodiments, the heat generating resistor 150 may include other metals or alloys. For example, the heat generating resistor 150 may include rhodium (Rh), palladium (Pd), tantalum (Ta), tungsten (W), platinum (Pt), a Ni—Cr alloy, a Fe—Cr alloy, a Fe—Cr—Al alloy, a PtRh alloy, or a La—Cr alloy.

As illustrated in FIG. 2, the ceramic body 110 may include an upper plate member 110_1 and a lower plate member 110_2, and the heat generating resistor 150 may be embedded between the upper plate member 110_1 and the lower plate member 110_2 to be disposed inside the ceramic body 110 in a manufacturing process thereof. For example, the upper plate member 110_1 and the lower plate member 110_2, which are ceramic molded bodies, may be provided respectively, and the lower plate member 110_2 may have an upper surface in which a groove (not shown) corresponding the desired arrangement of the heat generating resistor 150 is formed. A metal powder constituting the heat generating resistor 150 may be filled in these grooves or a pre-manufactured molded body may be disposed. Then, after bonding the upper plate member 110_1 to the lower plate member 110_2, the ceramic body 110 in which the heat generating resistor 150 is embedded may be manufactured by sintering a bonded body at a high temperature (about 1500° C. to about 2000° C.) in an inert atmosphere. In this sintering process, a sintering aid (e.g., yttria) containing yttrium or fluorine and a binder may be additionally used in metal powder for the heat generating resistor 150 and/or a ceramic molded body for the upper plate member 110_1 and the lower plate member 110_2.

As illustrated in FIGS. 2 and 3A, the ceramic body 110 may have a hole LH for a lift pin being penetrated in a vertical direction. The lift pin (not illustrated) may be elevated or lowered through the hole LH for the lift pin, and may lift the substrate W (which is disposed on the first surface 110T of the ceramic body 110) from the first surface 110T by using the elevation of the lift pin, or may seat the substrate W to load the same on the first surface 110T of the ceramic body 110.

Figure 4A:
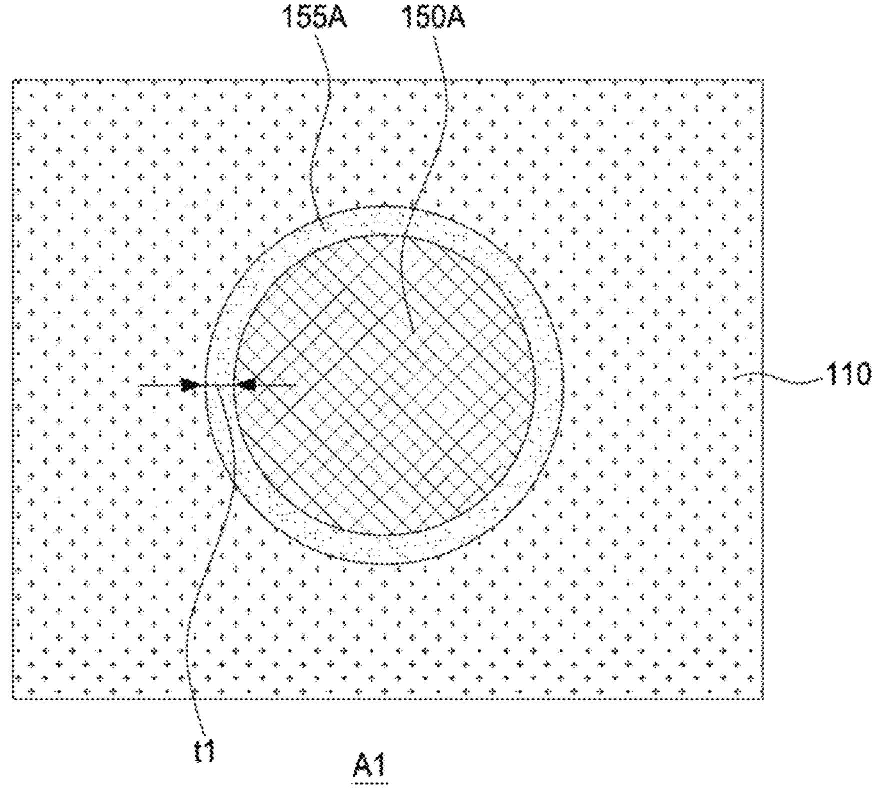
FIGS. 4A and 4B are partially enlarged views illustrating a region "A1" and a region "A2" in the substrate support unit of FIG. 3B, respectively.
Figure 4B:
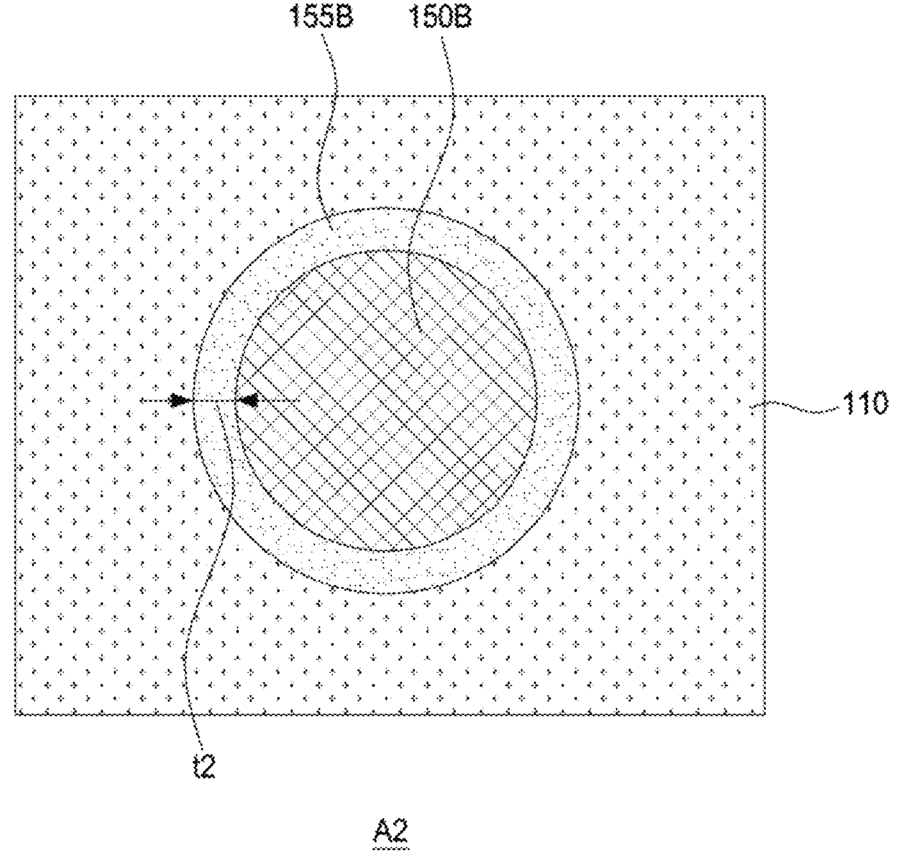

FIGS. 4A and 4B are partially enlarged views illustrating a region "A1" and a region "A2" in the substrate support unit 100 of FIG. 3B, respectively.

Referring to FIGS. 4A and 4B together with FIG. 3B, the substrate support unit 100 employed in the present example embodiment may include first and second stress relief coating layers 155A and 155B respectively surrounding the first and second heat generating resistors 150A and 150B.

The first and second stress relief coating layers 155A and 155B may serve to relieve internal stress due to a difference in a thermal expansion coefficient so that cracks are suppressed in the ceramic body 110.

The first and second stress relief coating layers 155A and 155B may include a material having an intermediate coefficient of thermal expansion relative to the coefficient of thermal expansion of first and second heat generating resistors 150A and 150B (e.g., molybdenum) and the coefficient of thermal expansion of the ceramic body 110 (e.g., AlN), i.e., a coefficient of thermal expansion that is between those of the first and second heat generating resistors 150A, 150B and the ceramic body 110.

In the present example embodiment, the first and second stress relief coating layers 155A and 155B may include molybdenum aluminum nitride (MoAlN). Molybdenum aluminum nitride may be expressed as AlN:Mo, where a molybdenum content or concentration may be expressed as a weight percent (wt %) relative to a total composition. The molybdenum concentration may be changed in various forms (as discussed below in connection with FIGS. 6A to 6C). For example, the molybdenum (Mo) concentration of the first and second stress relief coating layers 155A and 155B may be in a range of 0.5 wt % to 10 wt %, and in some example embodiments may be in a range of 1 wt % to 3 wt %.

The first and second stress relief coating layers 155A and 155B may have a thickness in a range of 10 μm to 100 μm, respectively.

Since the inner region 110A and the outer peripheral region 110B of the ceramic body 110 are heated to different temperatures, the ceramic body 110 may have a structure vulnerable to an influence of thermal stress, but may reduce an influence of thermal stress by introducing the first and second stress relief coating layers 155A and 155B on a surface of the first and second heat generating resistors 150A and 150B.

According to a process using the substrate processing apparatus 200 according to the present example embodiment, the substrate support unit may experience a large temperature change.

Figure 5:
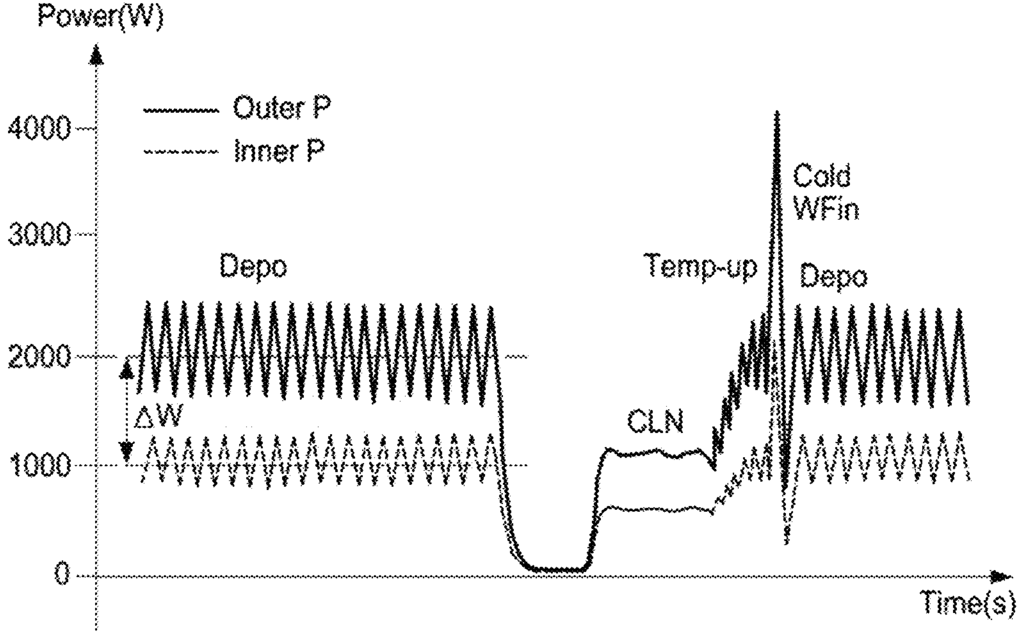
FIG. 5 is a graph illustrating power applied to a substrate support unit for each unit process.

FIG. 5 is a graph illustrating power applied to a substrate support unit for each unit process.

Referring to FIG. 5, a change in temperature according to a deposition process is exemplified. In order to heat the substrate processing apparatus to a first temperature (e.g., 565° C.) for the deposition process, a higher power may be applied to the second heat generating resistor 150B than to the first heat generating resistor 150A. In order to lower the applied power after the deposition process and heat the substrate processing apparatus to a second temperature (e.g., 480° C.) for a cleaning process inside the process chamber 210 before the deposition process, a higher power is applied to the second heat generating resistor 150B than the first heat generating resistor 150A, and power may be rapidly increased to maintain a temperature that fluctuates according to the disposition of the substrate W to instantaneously heat it.

As described above, according to a series of processes, a temperature of the ceramic body 110, which is a heating element, fluctuates significantly, and in particular, since different power is applied to the inner region 110A and the outer peripheral region 110B, a temperature deviation between the inner region 110A and the outer peripheral region 110B may be large. In particular, in the case of the dual-zone ceramic body 110 according to the present example embodiment, it may be severely exposed to the influence of thermal stress. However, the first and second stress relief coating layers 155A and 155B employed in the present example embodiment may be respectively introduced to a surface of the first and second heat generating resistors 150A and 150B to alleviate the influence of thermal stress.

In some example embodiments, the first and second stress relief coating layers 155A and 155B may be configured in different shapes according to heating temperature conditions to be respectively applied to the inner region 110A and the outer peripheral region 110B. For example, when the application temperature of the outer peripheral region 110B is higher than the application temperature of the inner region 110A, as illustrated in FIGS. 4A and 4B, a thickness t1 of the first stress relief coating layer 155A may be greater than a thickness t2 of the second stress relief coating layer 155B. In some example embodiments, the first stress relief coating layer 155A may have a composition (e.g., molybdenum concentration), different from that of the second stress relief coating layer 155B.

The substrate processing apparatus employed in the present example embodiment may be a PECVD apparatus as described above. For example, referring to FIG. 1, a shower head 240 may also function as an upper electrode of a parallel plate electrode.

Meanwhile, by disposing a lower electrode (ground electrode) (not shown) of a parallel plate electrode in the ceramic body 110 of the substrate support unit 100, and supplying high-frequency power to a shower head 240, a high-frequency electric field may be formed between the shower head 240 and the lower electrode 11, and process gas supplied from the shower head 240 may be converted into plasma by the high-frequency electric field. Although not shown, a plasma generating unit (not shown) for generating plasma from the process gas may be further included in the process chamber 210. For example, the plasma generating unit (not shown) may have a capacitive coupled plasma source or an induced coupled plasma source.

In the above-described embodiment, the substrate processing apparatus is exemplified as a PECVD apparatus, but the substrate support unit according to the present example embodiment may be advantageously employed in other types of substrate processing apparatuses for heating a substrate (e.g., a semiconductor wafer) to a high temperature. For example, in the substrate processing apparatus, in addition to the PECVD apparatus, the substrate processing apparatus may be implemented as a deposition apparatus such as other CVD apparatus or a sputtering apparatus an etching apparatus such as a plasma etching apparatus.

As described above, the molybdenum concentration may be variously changed depending on the embodiments (e.g., FIGS. 6A to 6C), and may be composed of a plurality of layers. A substrate support unit according to these various example embodiments is illustrated in FIGS. 6A to 6C.

Figure 6A:
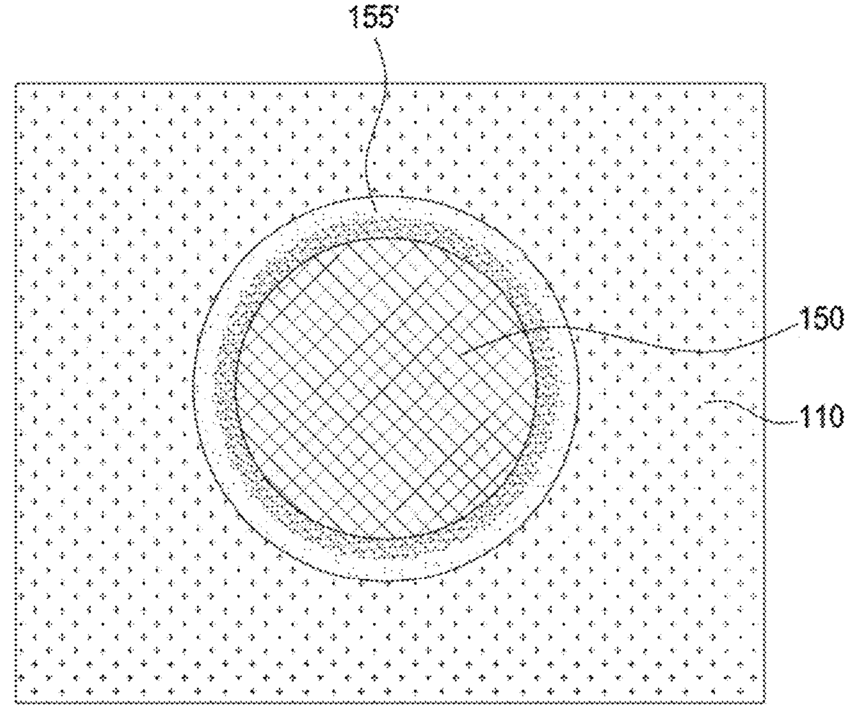
FIGS. 6A to 6C are cross-sectional views each illustrating a substrate support unit according to various example embodiments.
Figure 6B:
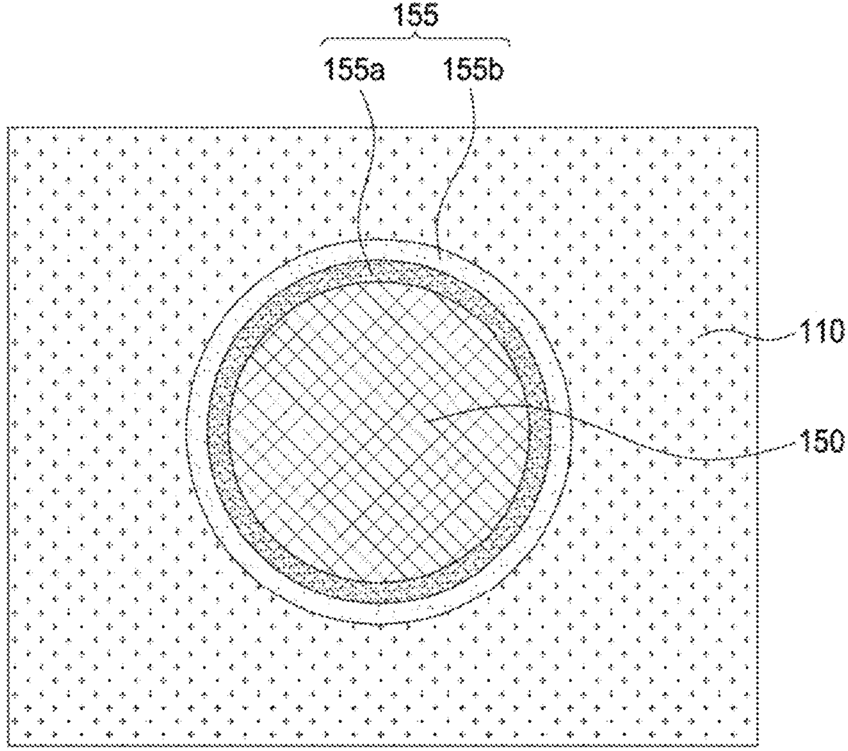
Figure 6C:
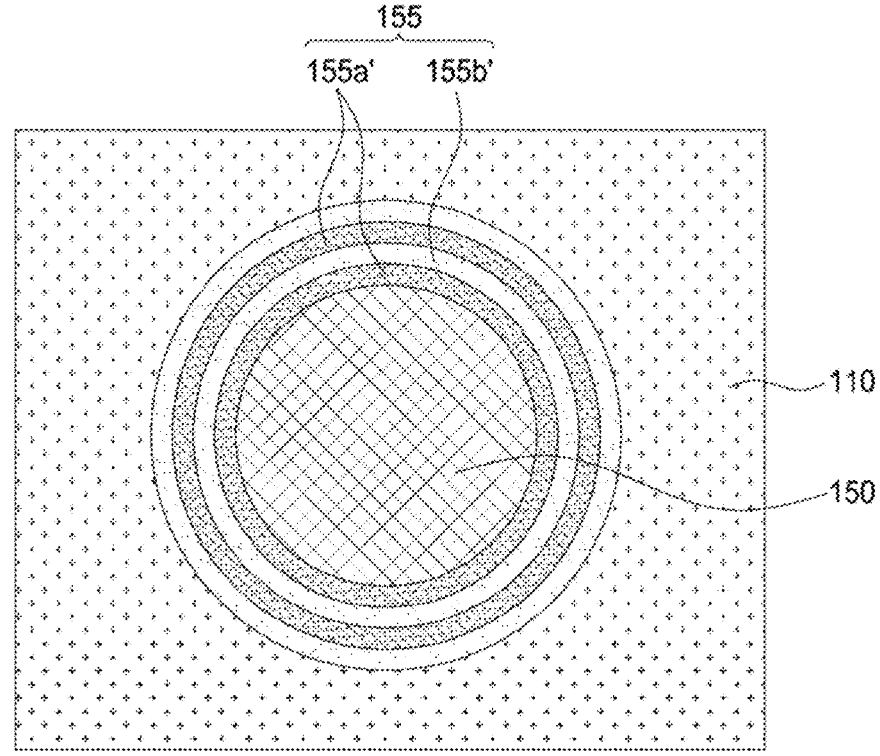

FIGS. 6A to 6C are cross-sectional views each illustrating a substrate support unit according to various example embodiments.

Cross-sections illustrated in FIGS. 6A to 6C may be understood as enlarged portions corresponding to "A1" or "A2" of FIG. 3B, respectively.

Referring to FIG. 6A, it may be understood as having a structure similar to the substrate support unit 100 illustrated in FIGS. 2 to 4, except that in the substrate support unit according to the present example embodiment, a stress relief coating layer 155' has a different composition distribution in its thickness direction. In addition, the components of the present example embodiment may be understood with reference to the descriptions of the same or similar components of the substrate support unit 100 shown in FIGS. 2 to 4, unless otherwise specified.

Similar to the previous embodiment, the ceramic body 110 may include aluminum nitride, and the heat generating resistor 150 may include molybdenum. The stress relief coating layer 155' employed in the present example embodiment may include molybdenum aluminum nitride having a different composition distribution in its thickness direction. In the stress relief coating layer 155' illustrated in FIG. 6A, the molybdenum concentration may be configured to gradually increase toward the inside. For example, this molybdenum concentration distribution may range from 0.5 wt % to 10 wt %. In addition, the stress relief coating layer 155' may have a thickness in the range of 10 μm to 100 μm.

In some example embodiments, the stress relief coating layer may be composed of a plurality of layers rather than a single layer. The plurality of layers may be composed of layers having different compositions, respectively.

For example, referring to FIGS. 6B and 6C, the substrate support unit according to the present example embodiment may be understood as having a structure similar to that of the substrate support unit 100 illustrated in FIGS. 2 to 4, except that the stress relief coating layer 155 is composed of a plurality of layers having different molybdenum concentrations. In addition, the components of the present example embodiment may be understood with reference to the descriptions of the same or similar components of the substrate support unit 100 illustrated in FIGS. 2 to 4, unless otherwise specified.

The stress relief coating layer 155 illustrated in FIG. 6B may include the first layer 155*a* surrounding the heat generating resistor 150 and containing molybdenum of a first concentration, and the second layer 155*b* surrounding the first layer 155*a* and containing molybdenum of a second concentration, lower than the first concentration. Although not limited thereto, e.g., the first concentration may be 3 wt % or more, and the second concentration may be 3 wt % or less. Each of the first and second layers 155*a* and 155*b* may have a thickness in a range of 5 μm to 80 μm.

In some example embodiments, the stress relief coating layer 155 may include three or more layers.

In an example embodiment (not shown), the stress relief coating layer 155 may further include a third layer surrounding the second layer 155*b* and including molybdenum having a third concentration, lower than the second concentration. For example, the first concentration may be 3 wt % or more, the second concentration may be in the range of 1 wt % to 5 wt %, and the third concentration may be 3 wt % or less. Each of the first layer 155*a*, the second layer 155*b*, and the third layer may have a thickness in a range of 2 μm to 50 μm.

The stress relief coating layer 155 illustrated in FIG. 6C may have a multilayer structure in which a first layer 155*a'* containing molybdenum of a first concentration and a second layer 155*b'* containing molybdenum of a second concentration, different from the first concentration, are alternately stacked. In the present example embodiment, the first and second layers 155*a'* and 155*b'* are each exemplified in a form of being stacked twice, but may be implemented in a structure in which any one layer is stacked two or more times (e.g., the second layer 155*b'* is disposed with the two first layers 155*a'* interposed therebetween). The first concentration may be 3 wt % or more, and the second concentration may be 3 wt % or less. In certain instances, the deviation of the first and second concentrations may be greater than or equal to 0.5 wt %. In addition, each of the first and second layers 155*a'* and 155*b'* may have a thickness in a range of 2 μm to 40 μm.

Figure 7:
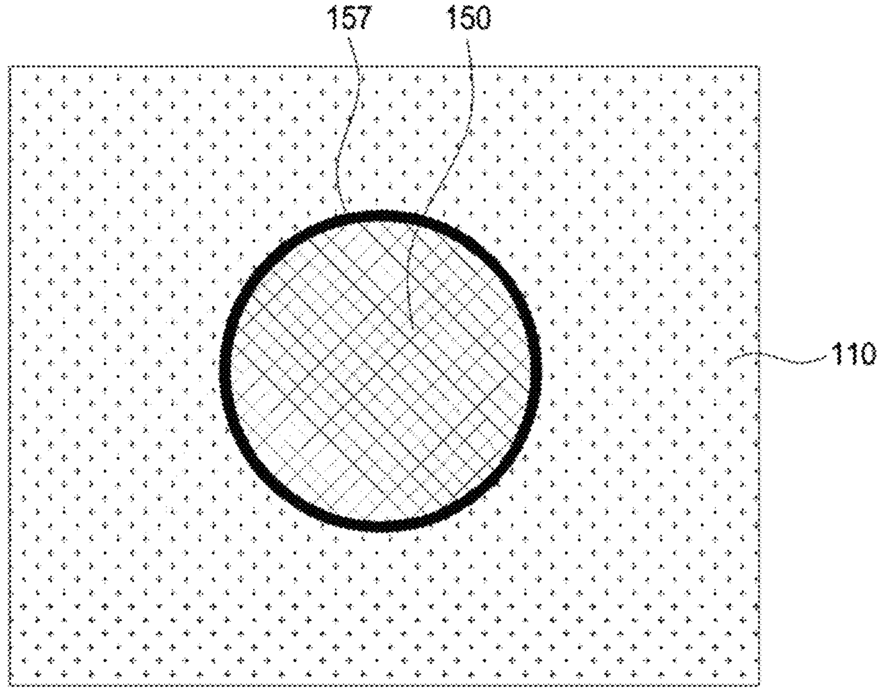
FIG. 7 is a cross-sectional view illustrating a substrate support unit according to an example embodiment.

FIG. 7 is a cross-sectional view illustrating a substrate support unit according to an example embodiment.

The cross-sectional view of FIG. 7 may be understood as an enlarged portion corresponding to "A1" or "A2" of FIG. 3B, respectively.

Referring to FIG. 7, the substrate support unit according to the present example embodiment may be understood as having a similar structure to the substrate support unit 100 illustrated in FIGS. 2 to 4, except that a diffusion preventing coating layer 157 is employed instead of a stress relief coating layer. In addition, the components of the present example embodiment may be understood with reference to the descriptions of the same or similar components of the substrate support unit 100 illustrated in FIGS. 2 to 4, unless otherwise specified.

In the present example embodiment, the ceramic body 110 may include, in addition to aluminum nitride, another material having excellent thermal conductivity, such as alumina ($Al_2O_3$) or silicon carbide (SiC).

The heat generating resistor 150 arranged inside the ceramic body 110 may include a metal or an alloy. The heat generating resistor 150, in addition to molybdenum (Mo), may include rhodium (Rh), palladium (Pd), tantalum (Ta), tungsten (W), platinum (Pt), a Ni—Cr alloy, a Fe—Cr alloy, a Fe—Cr—Al alloy, a PtRh alloy, or a La—Cr alloy.

The diffusion preventing coating layer 157 employed in the present example embodiment may be formed to surround the heat generating resistor 150.

The diffusion preventing coating layer 157 may be a layer doped with a diffusion preventing element, and the diffusion preventing element may include at least one element selected from Be, B, C, N, Mg, P, S, Sc, Ti, V, Cr, Mn, Fe, Co, Ni, Cu, Zn, Ga, Ge, and As. In addition, a base material of the diffusion preventing coating layer 157 may be the same material as that of the ceramic body 110. In some example embodiments, the diffusion preventing coating layer 157 may include magnesium (Mg)-doped aluminum nitride.

A thickness of the diffusion preventing coating layer 157 may be in a range of 5 μm to 50 μm.

Without being bound by theory, the diffusion preventing coating layer 157 employed in the present example embodiment may be introduced to suppress formation of aggregates due to diffusion of specific components during a process of use. As described above, in a sintering process for manufacturing the ceramic body 110, a sintering aid may be used for the heat generating resistor 150 and the ceramic material (e.g., a molded body) for the ceramic body 110. Through various experiments and simulations, the present inventors have newly found that a specific component of the sintering aid, e.g., an element such as yttrium or fluorine, is diffused in a course of use (high-temperature conditions) and aggregates to a specific region of the ceramic body 110 (e.g., around the heat generating resistor), and such agglomerates provide a cause of concentration of thermal stress.

Figure 8A:
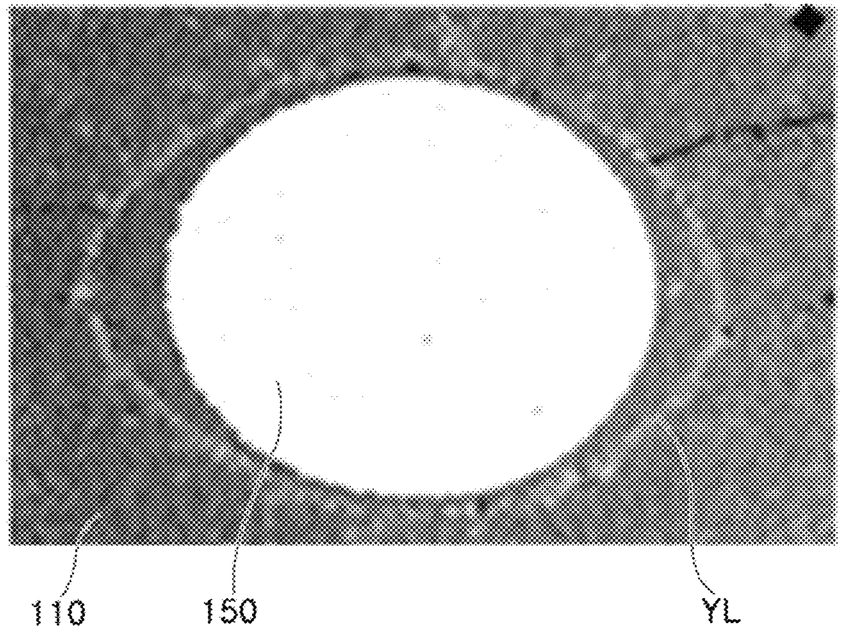
FIG. 8A is an SEM photograph illustrating yttrium diffusion around a heat generating resistor.
Figure 8B:
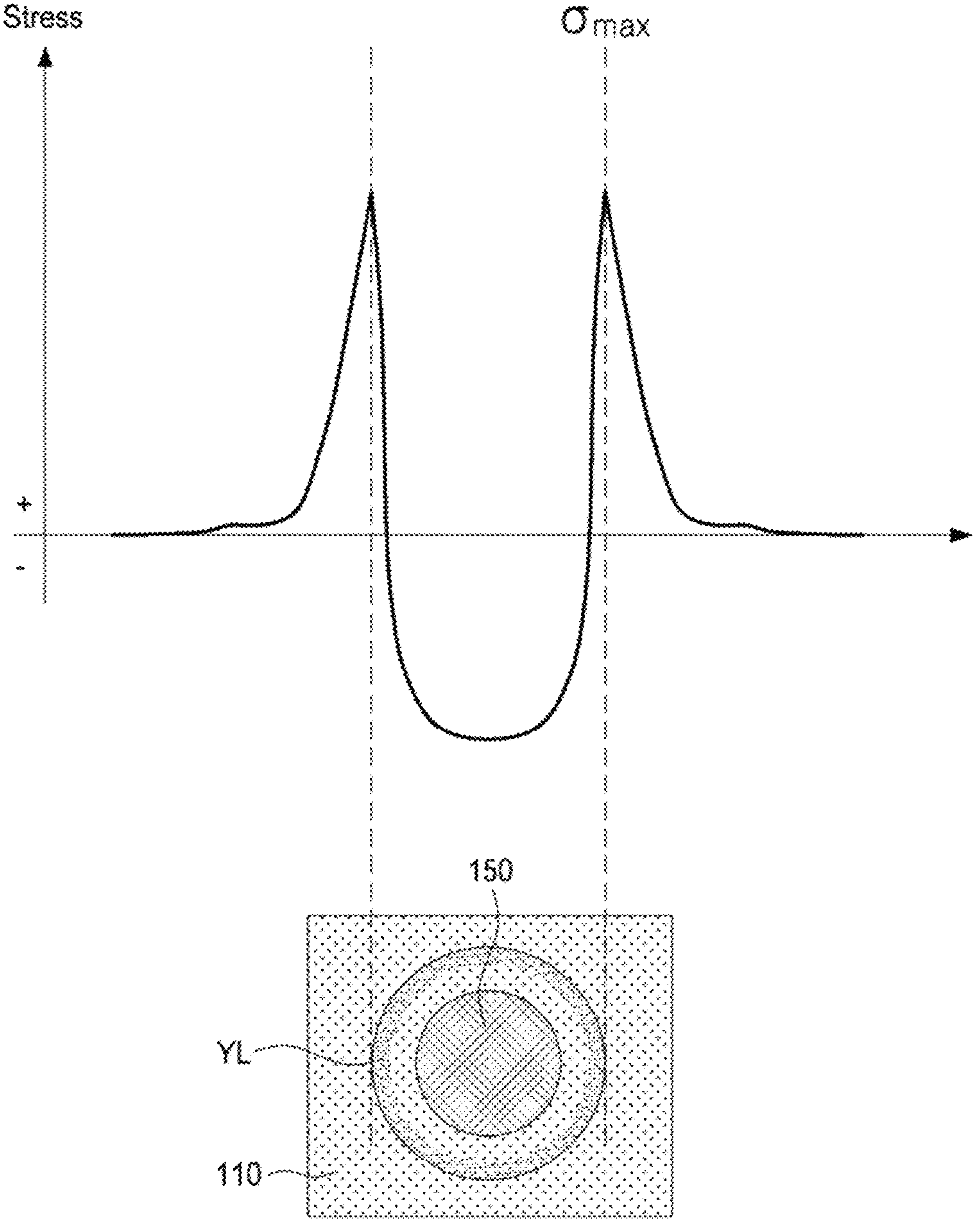
FIG. 8B is a schematic view illustrating a change in stress due to yttrium diffusion around a heat generating resistor.

FIG. 8A is an SEM photograph illustrating yttrium diffusion around a heat generating resistor, and FIG. 8B is a schematic view illustrating a change in stress due to yttrium diffusion around a heat generating resistor.

As a result of disassembling and confirming the substrate support unit used for a certain period of time, as illustrated in FIG. 8A, it could be confirmed that an agglomerate layer YL is formed in a ring shape in a region of the ceramic body 110 around the heat generating resistor 150, molybdenum. Without being bound by theory, this phenomenon may be presumed to be an agglomerate layer YL generated due to diffusion of an yttrium component from yttrium oxide (yttria) used as a sintering aid for the heat generating resistor 150. For example, when the ceramic body is a material containing Al (e.g., AlN), the agglomerate layer YL may be YAG ($Y_3Al_5O_{12}$).

As a result of measuring a stress distribution of the ceramic body 110 in a horizontal direction, as illustrated in FIG. 8B, it was confirmed that a thermal stress exhibited a maximum value in the yttrium agglomerate layer YL. As described above, it could be expected that a possibility of occurrence of cracks is greatly increased by inducing the concentration of thermal stress.

Figure 9:
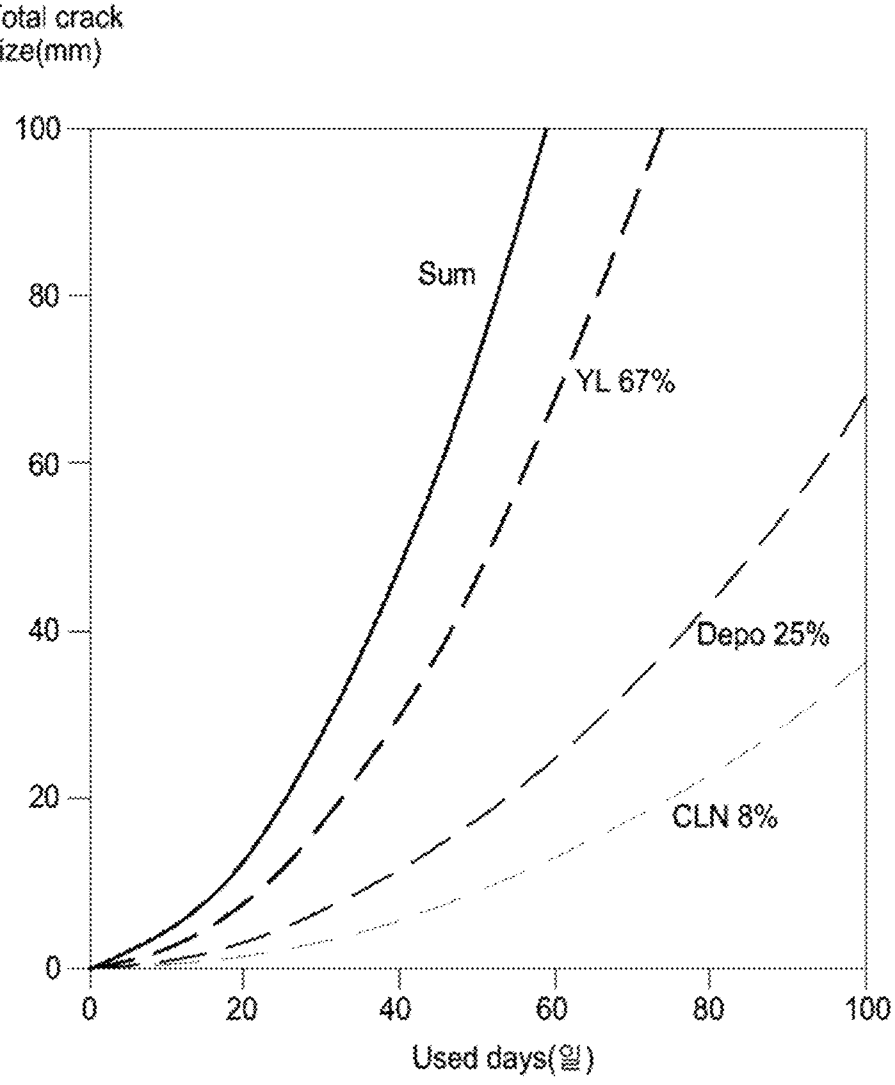
FIG. 9 is a graph illustrating an increase in cracks according to a usage time of a substrate support unit.

FIG. 9 illustrates simulation results (a ceramic body: AlN; a heat generating resistor: Mo) of crack generation due to each stress.

Referring to FIG. 9, it is illustrated that an entire crack size increases according to the number of use. In particular, looking at an effect of a cause of each major stress generation, it could be confirmed that an effect by an agglomerate layer YL containing yttrium was significantly greater than in an effect by a deposition process (Depo) (e.g., 25%) and an effect by a cleaning process (CLN) (e.g., 8%). Therefore, it can be expected that cracks in the ceramic body 110 can be significantly suppressed by reducing the diffusion of yttrium by introducing the diffusion preventing coating layer 157.

Without being bound by theory, the diffusion preventing coating layer 157 employed in the present example embodiment may have an effect of preventing aggregation of yttrium because the diffusion preventing coating layer 157 directly blocks the diffusion of the yttrium component in the heat generating resistor 150, or the diffusion preventing element is more quickly diffused to fill a vacancy of the ceramic body 110 than the yttrium component.

Figure 10A:
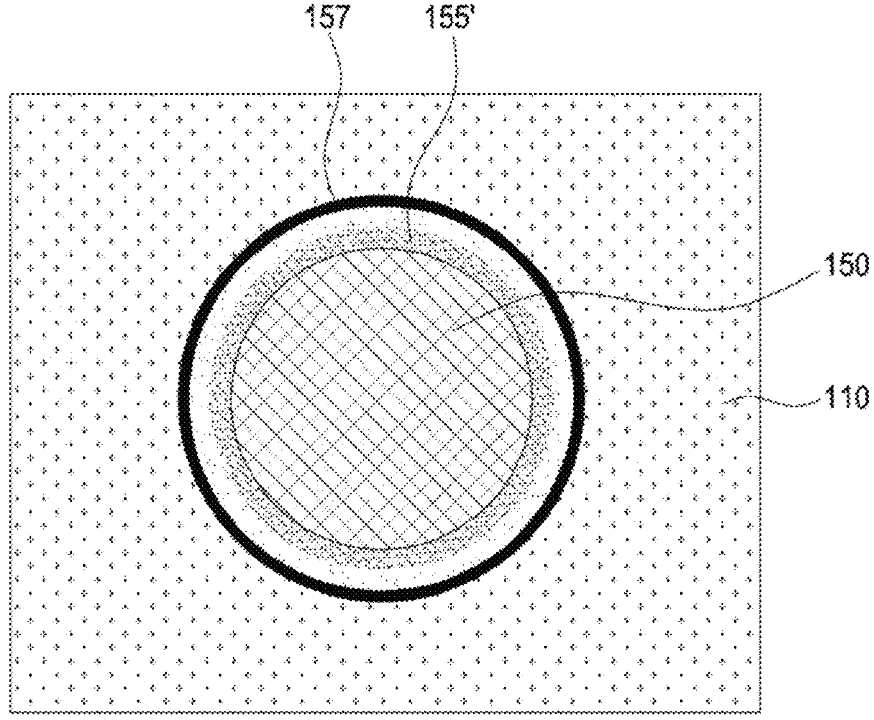
FIGS. 10A to 10C are cross-sectional views each illustrating a substrate support unit according to various example embodiments.
Figure 10B:
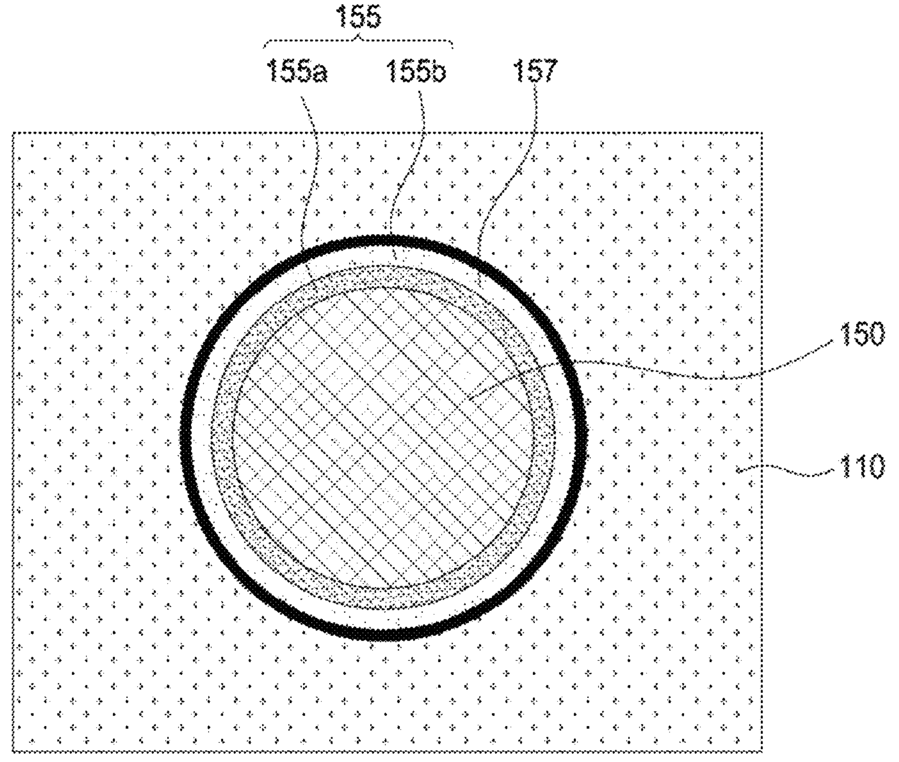
Figure 10C:
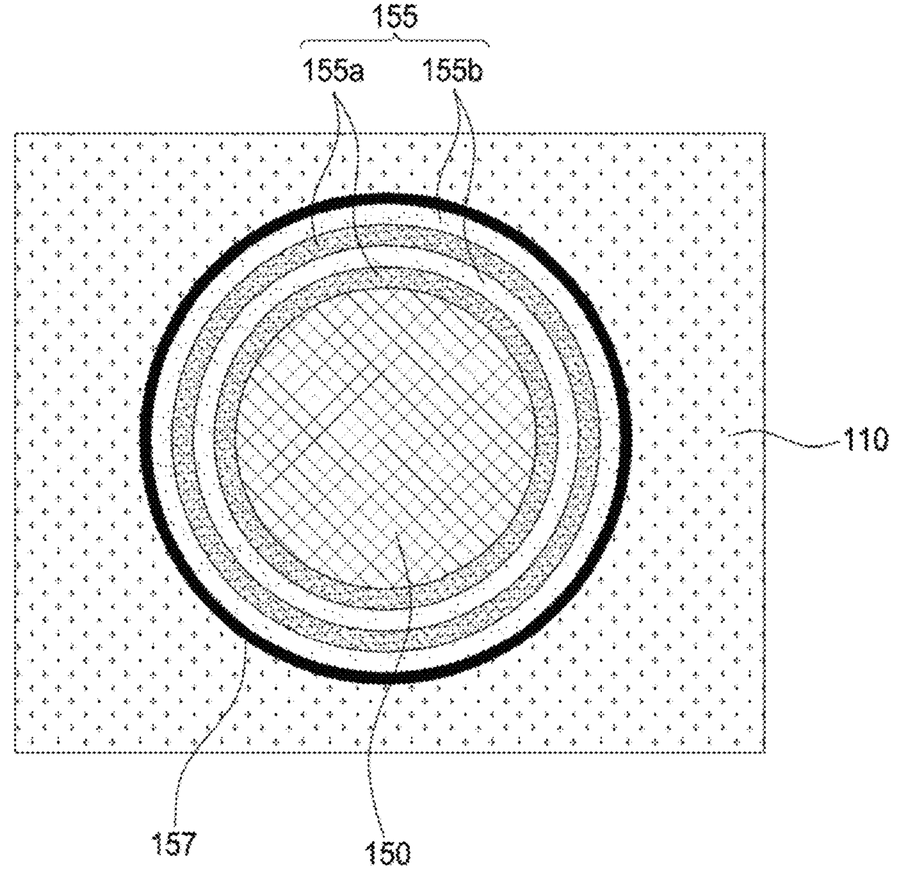

FIGS. 10A to 10C are cross-sectional views each illustrating a substrate support unit according to various example embodiments;

In the previous example embodiments, examples have been described in which either one of the stress relief coating layer 155 and the diffusion preventing coating layer 157 is introduced alone, but in some example embodiments, it may be implemented in a form in which the stress relief coating layer 155 and the diffusion preventing coating layer 157 are combined. A substrate support unit according to these various embodiments is illustrated in FIGS. 10A to 10C. Cross-sections of FIGS. 10A to 10C may be understood as enlarged portions corresponding to "A1" or "A2" of FIG. 3B, respectively.

Referring to FIG. 10A, it may be understood as having a structure similar to that of the substrate support unit 100 illustrated in FIGS. 2 to 4, except that the substrate support unit according to the present example embodiment includes the stress relief coating layer 155' and a diffusion preventing coating layer 157 surrounding the stress relief coating layer 155' having a different composition distribution in a thickness direction. In addition, the components of the present example embodiment may be understood with reference to the descriptions of the same or similar components of the substrate support unit 100 illustrated in FIGS. 2 to 4, unless otherwise specified.

In the present example embodiment, the stress relief coating layer 155' may be formed to surround the heat generating resistor 150, and may be configured so that the molybdenum concentration gradually increases toward the inside (refer to the description of FIG. 6A). In addition, the diffusion preventing coating layer 157 may be formed to surround the stress relief coating layer 155. The stress relief coating layer 155' may be introduced as an "inner coating layer", and the diffusion preventing coating layer 157 may be introduced as an "outer coating layer." A diffusion preventing element doped in the diffusion preventing coating layer may have a concentration that is lower than the molybdenum concentration of the stress relief coating layer. For example, the diffusion preventing element (e.g., Mg) may be doped into AlN at 0.5 at % or less.

In some example embodiments, the stress relief coating layer provided as the inner coating layer may be composed of a plurality of layers rather than a single layer. The plurality of layers may be composed of layers having different compositions.

Referring to FIGS. 10B and 10C, it may be understood as having a structure similar to that of the substrate support unit illustrated in FIGS. 2 to 4, except that the substrate support unit according to the present example embodiment includes the stress relief coating layer 155, and the diffusion preventing coating layer 157 surrounding the stress relief coating layer 155 composed of a plurality of layers. In addition, the components of the present example embodiment may be understood with reference to the descriptions of the same or similar components of the substrate support unit 100 illustrated in FIGS. 2 to 4, unless otherwise specified.

The stress relief coating layer 155 illustrated in FIG. 10B may include the first layer 155*a* surrounding the heat generating resistor 150 and containing molybdenum of a first concentration as a plurality of inner coating layers, and the second layer 155*b* surrounding the first layer 155*a* and containing molybdenum of a second concentration, lower than the first concentration (refer to the description of FIG. 6B). In addition, the diffusion preventing coating layer may be formed to surround the stress relief coating layer 155 to mitigate or eliminate an excessive concentration of thermal stress due to diffusion and aggregation of elements such as yttrium.

The stress relief coating layer 155 illustrated in FIG. 10C may have a multilayer structure in which the first layer 155*a*' containing molybdenum of a first concentration and the second layer 155*b*' containing molybdenum of a second concentration, different from the first concentration, are alternately stacked (refer to the description of FIG. 6C). Additionally, the diffusion preventing coating layer 157 may be formed to surround the stress relief coating layer 155 to mitigate or eliminate an excessive concentration of thermal stress due to diffusion and aggregation of elements such as yttrium.

In the substrate support unit illustrated in FIGS. 7 and 10A to 10C, only one heat generating resistor 150 is illustrated, but like the substrate support unit 100 described in connection with FIGS. 2 to 4B, may include a dual-zone ceramic body 110 in which a temperature in the inner region 110A and the outer peripheral region 110B may be independently controlled. In this case, first and second heat generating resistors 150A and 150, respectively disposed in the inner region 110A and the outer peripheral region 110B and separated from each other, may be included, and in this case, the diffusion preventing coating layer 157 may also be composed of first and second diffusion preventing coating layers respectively surrounding the first and second heat generating resistors 150A and 150B (or first and second stress relief coating layers 155A and 155B).

Figure 11:
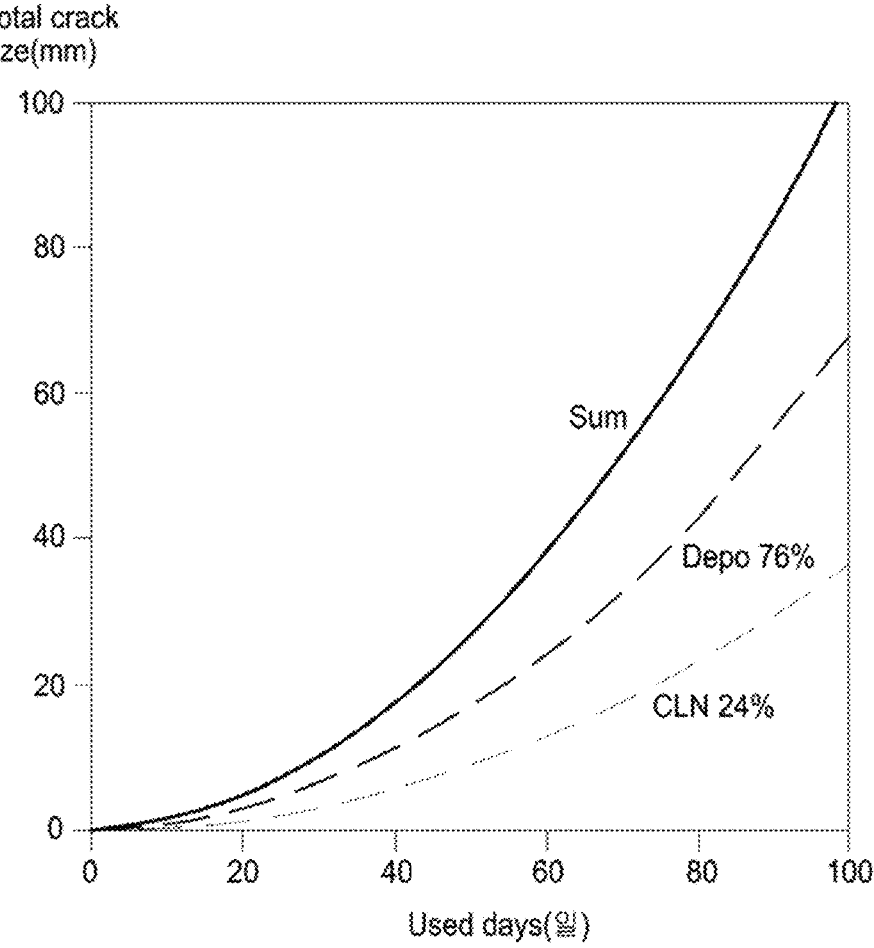
FIG. 11 is a graph illustrating an increase in cracks according to a usage time of a substrate support unit according to an example embodiment.

FIG. 11 is a graph illustrating an increase in cracks according to a usage time of a substrate support unit according to an example embodiment.

In FIG. 11, a distribution of cracks caused by each stress according to the number of days of use is illustrated as a simulation result for an example employing a combined form of a multi-layered stress relief coating layer and a diffusion preventing coating layer as a coating structure of a heat generating resistor, such as the substrate support unit (a ceramic body: AlN, a heat generating resistor: Mo) illustrated in FIG. 10B.

Referring to FIG. 11, it can be confirmed that crack generation is significantly suppressed compared to the result of FIG. 9. Without being bound by theory, the crack suppression is believed to be due to an influence of an agglomerate layer containing yttrium being suppressed, among influences of generation of main stress. Specifically, when viewed based on the number of days of use of 60 days, it could be confirmed that it was significantly reduced to about 40 mm with reference to FIG. 11, whereas it exceeded 100 mm in the comparative structure (see FIG. 9).

Figure 12A:
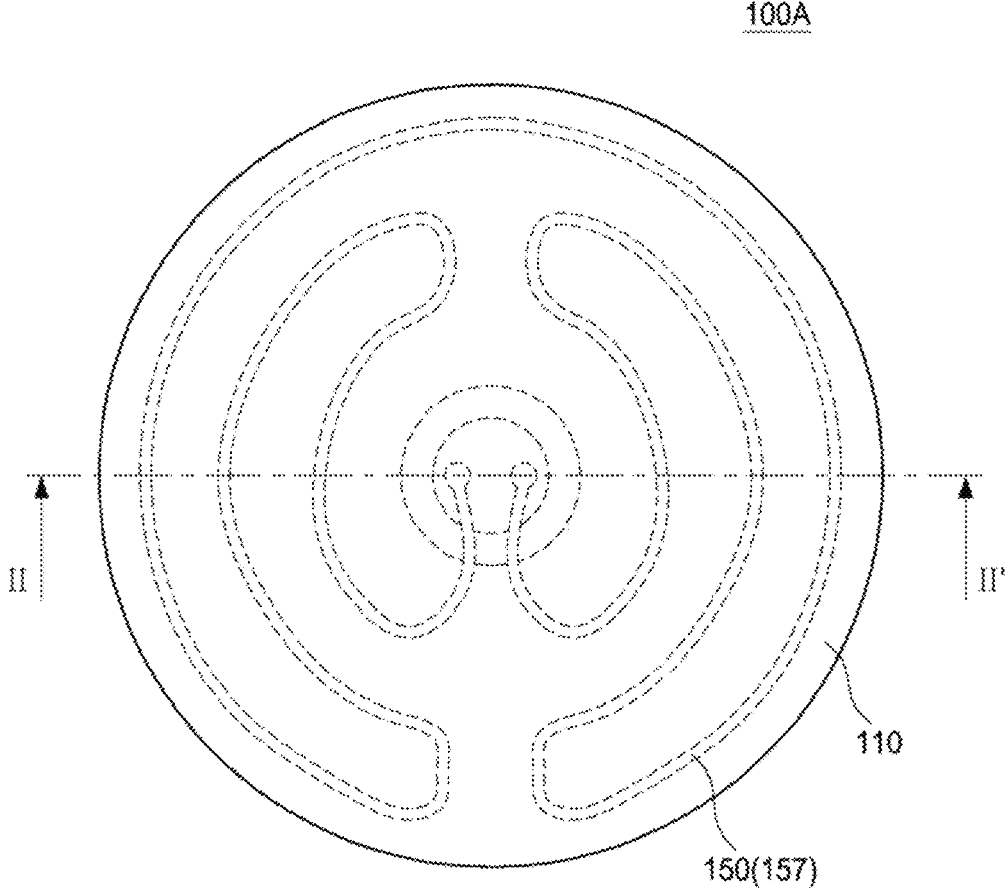
FIGS. 12A and 12B are a plan view and a cross-sectional view illustrating a substrate support unit according to an example embodiment.
Figure 12B:
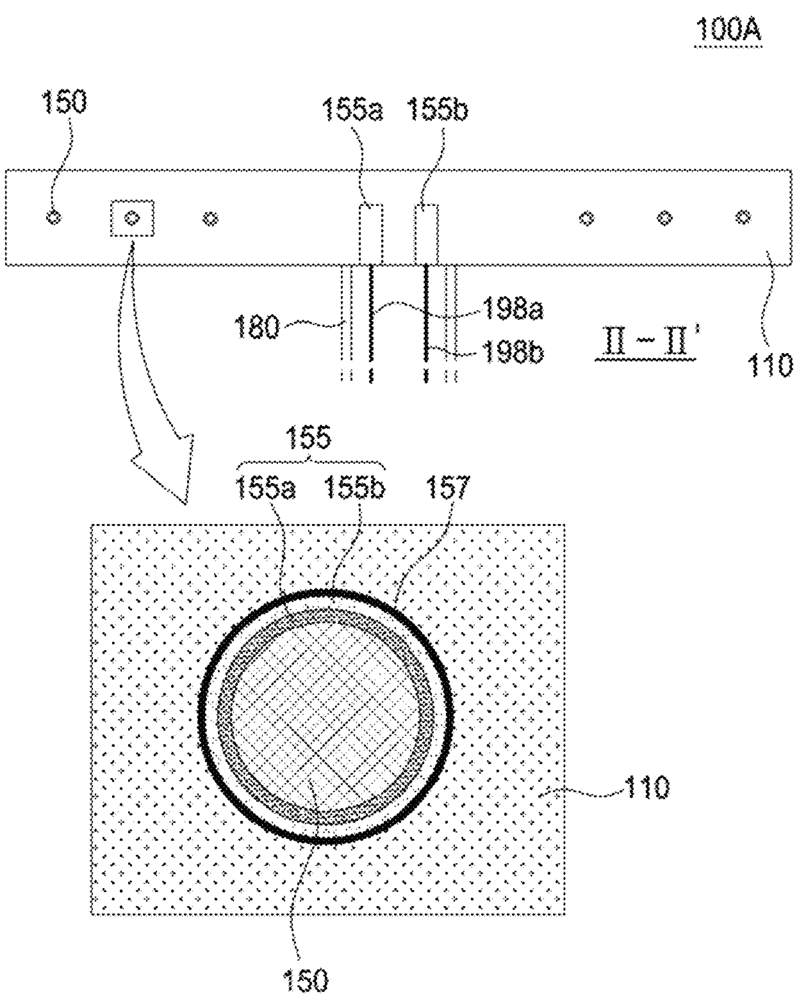

FIGS. 12A and 12B are a plan view and a cross-sectional view illustrating a substrate support unit according to an example embodiment.

Referring to FIGS. 12A and 12B, it can be understood that a substrate support unit 100A according to the present example embodiment has a structure, similar to that of the substrate support unit 100 illustrated in FIGS. 2 to 4, except that the ceramic body 110 and the heat generating resistor 150 are not configured as dual zones. In addition, the components of the present example embodiment may be understood with reference to the descriptions of the same or similar components of the substrate support unit 100 illustrated in FIGS. 2 to 4, unless otherwise specified.

The substrate support unit 100A according to the present example embodiment may include one heat generating resistor 150 radially arranged along an outer periphery in the ceramic body 110. The stress relief coating layer 155 may be formed as an inner coating layer on a surface of the heat generating resistor 150 employed in the present embodiment, and the diffusion preventing coating layer 157 may be formed to surround the stress relief coating layer 155.

The stress relief coating layer 155 employed in the present example embodiment may include molybdenum aluminum nitride (MoAlN). A molybdenum (Mo) concentration of the stress relief coating layer 155 may be in a range of 0.5 wt % to 10 wt %, and in some example embodiments may be in a range of 1 wt % to 3 wt %. In addition, the stress relief coating layer 155 may have a thickness in a range of 10 μm to 100 μm. The stress relief coating layer 155 may relieve thermal stress between the heat generating resistor 150 and the ceramic body 110.

The diffusion preventing coating layer 157 employed in the present example embodiment may be a layer doped with a diffusion preventing element. For example, the diffusion preventing element may include at least one selected from a group of Be, B, C, N, Mg, P, S, Sc, Ti, V, Cr, Mn, Fe, Co, Ni, Cu, Zn, Ga, Ge, and As. In some example embodiments, the diffusion preventing coating layer 157 may include magnesium (Mg)-doped aluminum nitride. A thickness of the diffusion preventing coating layer 157 may be in a range of 5 μm to 50 μm. The diffusion preventing coating layer 157 may be introduced to suppress generation of aggregates due to diffusion of specific components during use thereof, thereby suppressing cracks due to concentration of thermal stress.

By way of summation and review, a substrate processing apparatus for a semiconductor device manufacturing process may include, e.g., a deposition apparatus such as a CVD apparatus, a sputtering apparatus, and an etching apparatus such as a plasma etching apparatus. Such a substrate processing apparatus may include a heating apparatus for heating a semiconductor wafer to a high temperature. In some substrate processing apparatuses, the heating apparatus may be used in combination with a substrate support unit (e.g., a susceptor).

Embodiments may provide a substrate support unit coupled to a heat generating unit in which issues relating to internal stress are improved. Embodiments may provide a substrate processing apparatus having a substrate support unit in which issues relating to internal stress are improved.

As set forth above, in some example embodiments, cracks generated in a ceramic body due to internal thermal stress may be suppressed by forming a stress relief coating layer on a surface of a heat generating resistor. In particular, it may be advantageously applied in the ceramic body having dual zones heated to different temperatures. In some example embodiments, by forming a diffusion preventing coating layer on a heat generating resistor, it may be possible to effectively prevent a concentration of thermal stress due to diffusion of some elements (e.g., yttrium) used as a sintering aid, or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate support unit, comprising:

a ceramic body having a surface for supporting a substrate, and including aluminum nitride (AlN);

a heat generating resistor disposed in the ceramic body, and including molybdenum (Mo); and a coating layer surrounding the heat generating resistor, and including molybdenum aluminum nitride (MoAlN), wherein the coating layer includes a plurality of layers having different molybdenum (Mo) concentrations.

2. The substrate support unit as claimed in claim 1, wherein:

the ceramic body includes an inner region and an outer peripheral region surrounding the inner region, the heat generating resistor includes a first heat generating resistor arranged in the inner region, and the heat generating resistor includes a second heat generating resistor separated from the first heat generating resistor and arranged in the outer peripheral region.

3. The substrate support unit as claimed in claim 2, wherein:

the coating layer includes a first coating layer surrounding the first heat generating resistor, the coating layer includes a second coating layer surrounding the second heat generating resistor, and the first coating layer has a thickness greater than a thickness of the second coating layer.

4. The substrate support unit as claimed in claim 2, wherein:

the coating layer includes a first coating layer surrounding the first heat generating resistor, the coating layer includes a second coating layer surrounding the second heat generating resistor, and the first coating layer has a composition different from a composition of the second coating layer.

5. The substrate support unit as claimed in claim 1, further comprising:

an additional coating layer surrounding the coating layer, wherein the additional coating layer includes aluminum nitride doped with a diffusion preventing element, and wherein the diffusion preventing element includes at least one element from a group of Be, B, C, N, Mg, P, S, Sc, Ti, V, Cr, Mn, Fe, Co, Ni, Cu, Zn, Ga, Ge, and As.

6. The substrate support unit as claimed in claim 5, wherein the additional coating layer includes magnesium (Mg)-doped aluminum nitride.

7. The support substrate unit as claimed in claim 1, wherein the coating layer has a molybdenum (Mo) concentration in a range of 0.5 wt % to 10 wt %.

8. The substrate support unit as claimed in claim 1, wherein the coating layer has a molybdenum concentration gradually increasing toward an inside of the coating layer.

9. The substrate support unit as claimed in claim 1, wherein the plurality of layers includes:

a first layer surrounding the heat generating resistor and containing molybdenum (Mo) of a first concentration, and a second layer surrounding the first layer and containing molybdenum (Mo) of a second concentration that is lower than the first concentration.

10. The substrate support unit as claimed in claim 1, wherein:

the plurality of layers includes a first layer including molybdenum (Mo) of a first concentration and a second layer including molybdenum (Mo) of a second concentration different from the first concentration, and the first layer and the second layer are stacked.

11. The substrate support unit as claimed in claim 1, further comprising:

an outer coating layer, wherein the ceramic body includes an inner region and an outer peripheral region surrounding the inner region, wherein the heat generating resistor includes first and second heat generating resistors respectively disposed in the inner region and the outer peripheral region of the ceramic body, and separated from each other, wherein the outer coating layer surrounds each of the first and second heat generating resistors, the outer coating layer including a same material as the ceramic body, doped with a diffusion preventing element selected from a group of Be, B, C, N, Mg, P, S, Sc, Ti, V, Cr, Mn, Fe, Co, Ni, Cu, Zn, Ga, Ge, and As.

12. A substrate support unit, comprising:

a ceramic body having a surface for supporting a substrate, and including an inner region and an outer peripheral region surrounding the inner region, the ceramic body including a ceramic material;

a first heat generating resistor disposed within the ceramic body in the inner region and a second heat generating resistor disposed within the ceramic body in the outer peripheral region, each of the first and second heat generating resistors having a wire structure;

first and second inner coating layers directly contacting outer surfaces of the first and second heat generating resistors, respectively, the first and second inner coating layers including a material the same as a material of the ceramic body; and first and second outer coating layers surrounding the first and second inner coating layers, respectively, the first and second outer coating layers including aluminum nitride, wherein when viewed in cross-section, the first and second inner coating layers concentrically surround the first and second heat generating resistors, respectively, and the first and second outer coating layers concentrically surround the first and second inner coating layers, respectively.

13. The substrate support unit as claimed in claim 12, wherein the first and second outer coating layers are doped with a diffusion preventing element selected from Be, B, C, N, Mg, P, S, Sc, Ti, V, Cr, Mn, Fe, Co, Ni, Cu, Zn, Ga, Ge, and As.

14. The substrate support unit as claimed in claim 12, wherein the ceramic material includes aluminum nitride (AlN), alumina ($Al_2O_3$), or silicon carbide (SiC).

15. The substrate support unit as claimed in claim 12, wherein at least one of the first and second heat generating resistors includes a metal or an alloy selected from a group of molybdenum (Mo), rhodium (Rh), palladium (Pd), tantalum (Ta), tungsten (W), platinum (Pt), a Ni—Cr alloy, a Fe—Cr alloy, a Fe—Cr—Al alloy, PtRh alloy, and a La—Cr alloy.

16. The substrate support unit as claimed in claim 12,
wherein the ceramic body includes aluminum nitride (AlN),
wherein the first and second heat generating resistors include molybdenum (Mo),
wherein the first and second inner coating layers include molybdenum aluminum nitride (MoAlN).

17. The substrate support unit as claimed in claim 16, wherein each of the first and second inner coating layers has a molybdenum (Mo) concentration in a range of 0.5 wt % to 10 wt %.

18. The substrate support unit as claimed in claim 16, wherein each of the first and second inner coating layers has a thickness in a range of 10 μm to 100 μm.

19. The substrate support unit as claimed in claim 12, wherein each of the first and second outer coating layers has a thickness in a range of 5 μm to 50 μm.

20. A substrate support unit, comprising:
a ceramic body having a first surface for supporting a substrate and a second surface opposite to the first surface, the ceramic body including aluminum nitride (AlN);
a heat generating resistor disposed in the ceramic body, and including molybdenum (Mo), the heat generating resistor having a wire structure;
a first inner coating layer surrounding the heat generating resistor and a second inner coating layer surrounding the first inner coating layer, each of the first and second inner coating layers including molybdenum (Mo); and
an outer coating layer surrounding the first and second inner coating layers, the outer coating layer including aluminum nitride doped with magnesium (Mg),
wherein when viewed in cross-section, the first inner coating layer concentrically surrounds the heat generating resistor and directly contacts an outer surface of the heat generating resistor, the second inner coating layer concentrically surrounds the first inner coating layer and directly contacts an outer surface of the first inner coating layer, and the outer coating layer concentrically surrounds the second inner coating layer and directly contacts an outer surface of the second inner coating layer.

* * * * *